US005773170A

United States Patent [19]

Patel et al.

[11] Patent Number: 5,773,170
[45] Date of Patent: Jun. 30, 1998

[54] UV-ABSORBING MEDIA BLEACHABLE BY IR-RADIATION

[75] Inventors: Ranjan C. Patel, Little Hallingbury; Robert J. D. Nairne, Bishop's Stortford, both of Great Britain

[73] Assignee: Minnesota Mining and Manufacturing Co., St. Paul, Minn.

[21] Appl. No.: 627,825

[22] Filed: Apr. 2, 1996

[30] Foreign Application Priority Data

Apr. 20, 1995 [GB] United Kingdom ............... 9508031

[51] Int. Cl.$^6$ .............................. G03F 9/00; B41M 5/20; B32B 3/00
[52] U.S. Cl. ......................... 430/5; 430/200; 430/332; 430/333; 430/339; 430/945; 503/218; 503/225; 428/195
[58] Field of Search .............................. 430/915, 5, 945, 430/270.1, 332, 333, 339, 200, 944; 503/218, 225; 428/195

[56] References Cited

U.S. PATENT DOCUMENTS

| | | | |
|---|---|---|---|
| 3,595,658 | 7/1971 | Gerlach et al. | 96/48 |
| 3,615,432 | 10/1971 | Jenkins et al. | 96/27 |
| 4,701,402 | 10/1987 | Patel et al. | 430/332 |
| 4,769,459 | 9/1988 | Patel et al. | 544/301 |
| 4,894,358 | 1/1990 | Filosa et al. | 503/201 |
| 4,981,833 | 1/1991 | Sato | 503/202 |
| 5,171,650 | 12/1992 | Ellis et al. | 430/20 |
| 5,314,795 | 5/1994 | Helland et al. | 430/517 |
| 5,510,227 | 4/1996 | DoMinh et al. | 430/269 |
| 5,576,142 | 11/1996 | Neumann et al. | 430/269 |
| 5,576,144 | 11/1996 | Pearce et al. | 430/270.15 |
| 5,599,578 | 2/1997 | Butland | 427/7 |

FOREIGN PATENT DOCUMENTS

| | | |
|---|---|---|
| 0 109 772 | 5/1984 | European Pat. Off. . |
| 0 182 332 | 5/1986 | European Pat. Off. . |
| 210409 | 2/1987 | European Pat. Off. . |
| 0 331 494 | 9/1989 | European Pat. Off. . |
| 0 465 727 A1 | 1/1992 | European Pat. Off. . |
| 0 488 530 A2 | 6/1992 | European Pat. Off. . |
| 0 515 133 A2 | 11/1992 | European Pat. Off. . |
| 0 675 003 | 10/1995 | European Pat. Off. . |
| 0 687 568 A2 | 12/1995 | European Pat. Off. . |
| WO 88/04237 | 6/1988 | WIPO . |
| WO 90/12342 | 10/1990 | WIPO . |
| WO 93/03928 | 3/1993 | WIPO . |
| WO 93/04411 | 3/1993 | WIPO . |

OTHER PUBLICATIONS

J. Org. Chem 1993 58,2614–2618.
Journal of Imaging Science & Technology vol. 37, No. 2, Mar./Apr. 1993, pp. 149–155.
J. Am. Chem Soc. 1981, 103,6495–6497.

*Primary Examiner*—Janet C. Baxter
*Assistant Examiner*—Rosemary Ashton
*Attorney, Agent, or Firm*—Walter Kirn; Gregory A. Evearitt; Arlene K. Musser

[57] ABSTRACT

An image-forming element comprising a substrate, and an image-forming medium comprising (a) a compound absorbing at a first wavelength in the UV/blue region and (b) a dye absorbing at a second wavelength which is longer than the first wavelength, irradiation at said second wavelength bleaching absorption of said compound at said first wavelength, said element being free of thermally unstable urea and/or carbamate molecules.

35 Claims, 1 Drawing Sheet

UV-ABSORBING MEDIA BLEACHABLE BY IR-RADIATION

FIELD OF THE INVENTION

The invention relates to UV absorbing media which are bleachable by IR irradiation to provide images suitable for use as masks.

BACKGROUND TO THE INVENTION

There is continuing interest in image-forming media suitable for address by lasers, particularly media which require no wet processing. Such media are particularly useful in medical imaging, recording the output of digital radiographic equipment, CAT scanners, magnetic resonance scanners and ultrasound scanners on film or paper, and graphic arts imaging, producing contact films, colour proofs and printing plates. While some laser addressable media have been described, relatively few examples have been commercialised.

In the graphic arts industry, productivity is an issue, since economics dictate that the same scanner should be used to output three conventional types of media, namely films, proofs and plates. The ability to provide two out of three of these media simultaneously would clearly increase productivity.

It is desirable to provide medical imaging films that are a neutral black colour in image areas with minimal visible absorption in background areas and continuous tone capability to facilitate inspection and interpretation by the human eye. Graphic arts films are intended to be used as contact masks for the subsequent imaging of plates, proofs and other films. Subsequent imaging through masks is normally performed by flood exposure to UV/blue light. The image areas should show a high absorption of UV/blue radiation while the background areas are essentially transparent at these wavelengths for such masks to be effective. The image areas must also absorb over at least a portion of the visible spectrum to allow visual inspection of the image. A neutral black colour is preferred. A high contrast suitable for half tone imaging is also desirable.

There are a number of techniques for the direct generation of monochrome images from laser exposure. A well known approach described in U.S. Pat. No. 3,962,513 and U.S. Pat. No. 5,171,650 is the ablation of a pigmented layer, for example, one containing carbon black, from a transparent substrate by laser irradiation. In a variation of this method, the exposed areas of the pigmented coating are transferred to a receptor held in intimate contact with the coating layer, as described in WO 90/12342, U.S. Pat. No. 5,171,650 and IBM Technical Disclosure Bulletin Vol. 18, No. 12, May 1976, p. 4142. EP-A-0465 727 discloses the transfer of UV absorbing dyes or pigments as a method of forming a graphic arts film. The partitioning of a pigmented layer between two substrates as a result of laser exposure is disclosed in WO 93/04411, WO 93/03928, WO 88/04237 and U.S. Pat. No. 5,352,562. These materials are inherently high contrast materials and are not adapted to continuous tone imaging.

U.S. Pat. No. 4,981,765 and 5,262,275 and EP-A-0,488,530 disclose the thermal transfer of dyes or pigments directly onto the photosensitive coating of a printing plate or similar element so as to form an integral mask.

U.S. Pat. No. 4,826,976, 4,720,449, 4,960,901 and 4,745,046 and WO 90/00978 disclose imaging materials which develop a colour in response to heat, which may be supplied through absorption of laser radiation. Yellow, magenta and cyan colours are disclosed.

U.S. Pat. No. 4,602,263 and U.S. Pat. No. 4,720,450 disclose imaging systems which bleach under the action of heat by fragmentation of thermally unstable carbamate and urea derivatives, respectively. The heat may be supplied through absorption of laser irradiation.

Colour proofs may be formed by transferring, by laser exposure, successive images of different colours from appropriate donors to a common receptor, as described in WO 90/12342. Although this publication discloses that the individual donor sheets, following image transfer, are effectively film masks containing image information for their respective colours, such materials are of limited use as graphic arts films because many dyes and pigments commonly used in colour proofing tend to have insufficient UV/blue absorption.

Laser transfer of a pigmented layer from a transparent donor to a receptor having a surface adapted for lithographic printing, such as a grained aluminium foil, and thereby producing simultaneously a film mask and a printing plate is disclosed in U.S. Pat. No. 3,962,513. Single-sheet materials that function as both a film and a plate are not disclosed.

Photoredox processes involving dyes are well known in the art. A photoexcited dye may accept an electron from a coreactant, the dye acting as a photo-oxidant, or donate an electron to a coreactant, the dye acting as a photoreductant, depending on the properties of the dye and of the coreactant(s). Such processes have frequently been exploited for imaging purposes, but in general it is the bleaching of the dye that forms the image. Examples of this type of imaging include the photobleaching of cationic dyes in the presence of organoborate ions (U.S. Pat. No. 4,447,521 and 4,343,891) and the photobleaching of pyrylium dyes in the presence of allylthiourea derivatives (J.Imaging Sci. & Technol. 1993 (37), 149–155). Alternatively, the products of the photoredox reaction may participate in further reactions that lead to image formation.

Photoredox processes in which a dye acts as a photo-oxidant, i.e., in its photoexcited state it accepts an electron from a suitable reductant, are of particular relevance to the preferred embodiments of the present invention.

The products of the photoredox reaction may initiate polymerisation (as described in EP-A-515133, J.Org.Chem. 1993 (58), 2614–8, and J.Am.Chem.Soc. 1988 (110), 2326–8, or inhibit polymerisation (as described in U.S. Pat. No. 4,816,379). There are no known references to photoredox imaging processes involving a dye and a reducing agent in which bleaching of the reducing agent is the primary image forming process.

The ability of dihydropyridine derivatives to transfer an electron to a photoexcited Ru(III) complex is disclosed in J.Amer.Chem.Soc. 1981 (103), 6495–7. The reactions were carried out in solution and were not used for imaging purposes.

British Patent Application No. 9508027 laser addressable thermal imaging media comprising a photothermal converting dye and a dihydropyridine derivative. Bleaching of the photothermal converting dye occurs during laser exposure, and the effect is exploited for the production of uncontaminated colour images.

BRIEF SUMMARY OF THE INVENTION

The present invention provides image-forming media, comprising (a) a compound absorbing at a first wavelength in the UV/blue region and (b) a dye absorbing at a second wavelength which is longer than the first wavelength, irradiation of the media at the second wavelength bleaching absorption of the compound (a) at the first wavelength, said media being free of thermally unstable urea and/or carbamate molecules.

DESCRIPTION OF PREFERRED EMBODIMENTS

Figure 1:
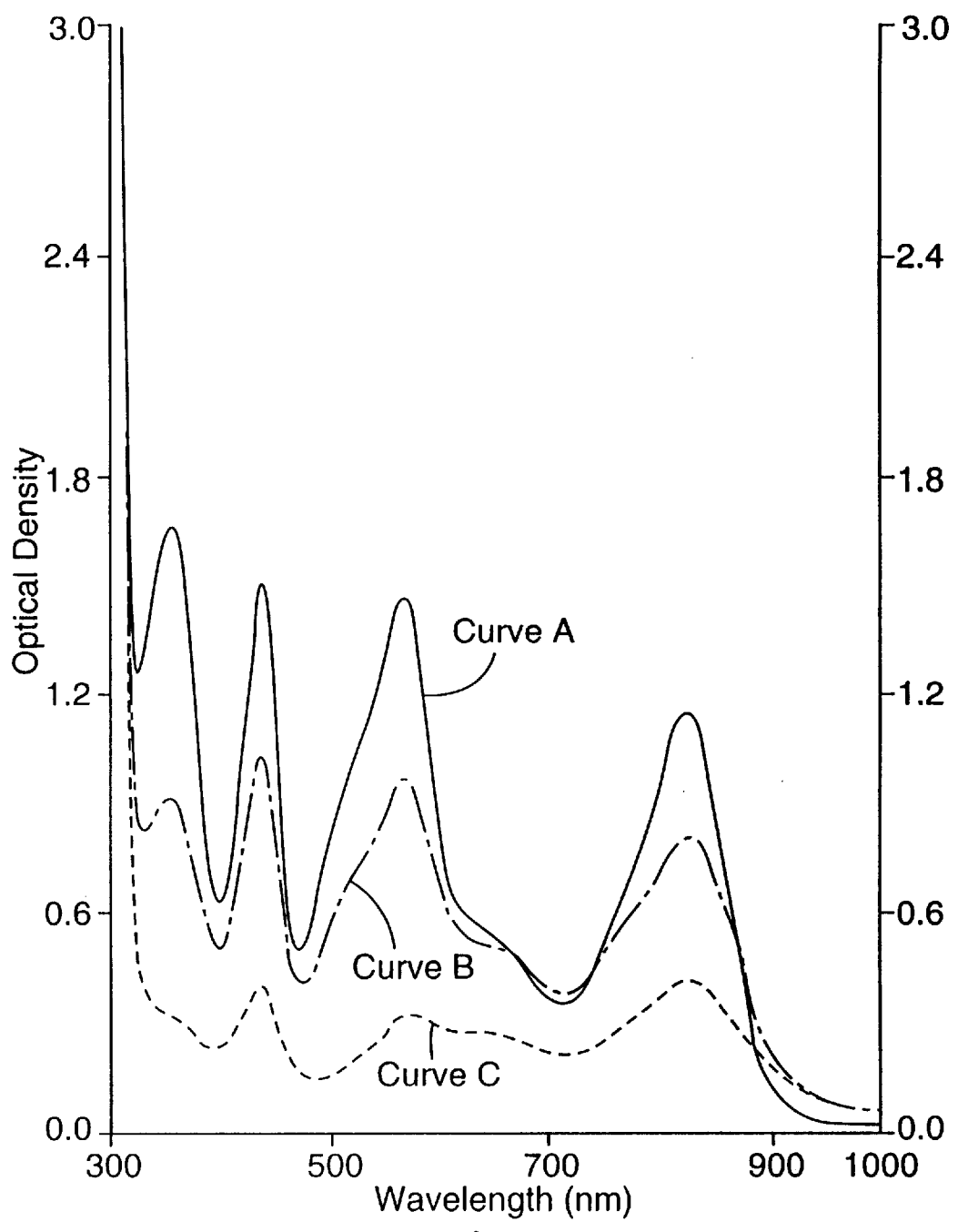

Preferably the second wavelength is in the red or near infrared region, and irradiation is carried out by a laser.

The image-forming media of the invention, in the form of a coating on a transparent substrate, may be used as a mask for the imagewise exposure of a UV sensitive material such as a printing plate, photoresist or proofing element. Alternatively, the image forming media of the invention may be incorporated into an imaging element possessing a further image forming medium sensitive to UV/blue radiation. Such an element could comprise a first imaging medium comprising components (a) and (b) defined above and a second imaging medium sensitive to UV/blue radiation. Initial exposure to radiation at said second wavelength generates an image in the first imaging medium which acts as a mask for exposure of the second imaging medium to UV/blue radiation. The second imaging medium may conveniently be in the form of a printing plate as part of the imaging element.

In the context of this invention, "UV/blue region" refers to a portion of the spectrum ranging from about 340 nm to about 480 nm. "Bleaching" refers to a decrease in optical density either by elimination of the relevant absorption bands or by their shift to shorter wavelengths.

Imaging media in accordance with the invention are initially opaque to UV/blue light, but become transparent on exposure to light of the appropriate (longer) wavelength, i.e., they are positive-acting. They are well suited to digital address by lasers, and require no processing to develop or fix the image. No ablation or transfer of colourant is involved in the simplest embodiments, and there are no waste materials requiring disposal.

The resulting pattern of UV-opaque and TV-transparent areas is used as a mask for the imagewise exposure of a UV-sensitive material and according to a further aspect of the invention there is provided an imaging method comprising the steps of:
(i) providing a first imaging element comprising a transparent substrate, a compound absorbing at a first wavelength in the UV/blue region, and a dye absorbing at a second wavelength which is longer than said first wavelength;
(ii) exposing said first element to a pattern of radiation of the said second wavelength to bleach absorption at said first wavelength;
(iii) assembling said first element in contact with a second imaging element which is sensitive to light of the first wavelength; and
(iv) exposing the assembly to a source of light at the first wavelength with the first imaging element closest to the source.

It will normally be necessary to subject the second imaging element to one or more processing steps to develop and/or fix the final image, depending on the constitution of said element.

The "first wavelength" is intended to reflect a range of wavelengths rather than a single precise wavelength. For example, said compound may absorb at wavelengths between 340 and 410, with maximum absorption at 390 nm. The exposure of step (iv) may be made at any wavelength within the first absorption range, not merely at the maximum absorption wavelength within that range.

When the imaging medium of the present invention is used as an integral mask, the imaging element comprises a substrate, a first imaging medium and a second imaging medium, said first imaging medium comprising (a) a compound absorbing at a first wavelength in the UV/blue region and (b) a dye absorbing at a second wavelength which is longer than said first wavelength, irradiation of the medium at said second wavelength bleaching absorption of the compound (a) at the first wavelength, and said second imaging medium being sensitive to light of said first wavelength, the first imaging medium being placed (optically and physically) such that an image formed in said first imaging medium may act as an exposure mask for the second imaging medium.

This aspect of the invention further extends to a method of forming an image comprising the steps of:
(i) providing an imaging element as described in the preceding paragraph;
(ii) exposing the element to a pattern of radiation at the said second wavelength;
(iii) exposing the element to a source of radiation of the said first wavelength; and
(iv) processing the element to develop an image in said second imaging medium.

The imaging media of the invention comprise two key ingredients, namely (a) a compound absorbing at a relatively short wavelength and (b) a dye absorbing at a longer wavelength, and these must be selected such that light absorption by the latter ultimately causes bleaching of the former, and hence the identity of one of these ingredients may govern the identity of the other. A variety of mechanisms may bring about the desired bleaching. For example, the compound (a) absorbing at the shorter wavelength may decompose or rearrange thermally as a result of heat generated through absorption of laser radiation by the dye. Alternatively (or additionally), the compound (a) absorbing at shorter wavelengths may be acid-sensitive, and photoirradiation of the dye may generate a strong acid. Suitable compounds which bleach under the action of heat and/or acid include those of formulae I and II:

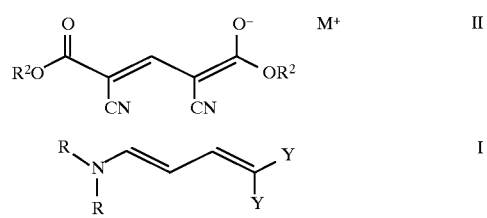

in which each R is independently selected from an alkyl group (preferably of up to 20 carbon atoms) or an aryl group of up to 10 (preferably 6) ring carbon atoms, or both R groups together complete a non-aromatic ring (such as morpholine or pyrrolidine);

each Y is independently selected from an electron-attracting group such as CN, $COR^1$, $CO_2R^1$, $SO_2R^1$ where $R^1$ is alkyl or aryl, or both Y groups together represent the atoms selected from C, O, N, and S required to complete a ring with electron-attracting properties (such as barbituric acid, isopropylidene malonate, dimedone etc.);

each $R^2$ is independently selected from an alkyl group (preferably of up to 20 carbon atoms) or an aryl group of up to 10 (preferably 6) ring carbon atoms; and $M^+$ represents a monovalent cation (such as $Na^+$, $K^+$, $NH_4^+$).

Specific examples of compounds of formulae I and II include:

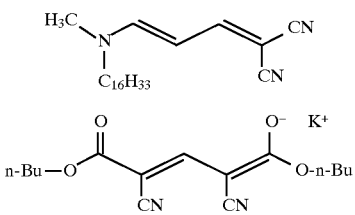

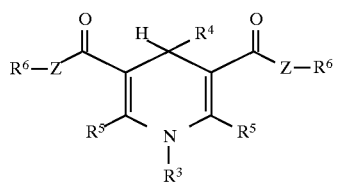

A further mechanism for bleaching of compound (a) involves a photoredox reaction between the dye and the compound (a) giving rise to the short wavelength absorption, in particular photoreduction of the dye by the compound (a). In other words, compound (a) transfers an electron to the dye when the latter is in a photoexcited state, and in the process compound (a) undergoes bleaching. A preferred class of compounds absorbing in the UV/blue region, having the formula III below, are believed to operate by this mechanism.

$$R^6-Z-\overset{O}{\underset{}{C}}-\underset{R^5}{\overset{H}{\underset{}{C}}}-\underset{R^5}{\overset{R^4}{\underset{}{C}}}-\overset{O}{\underset{}{C}}-Z-R^6 \qquad III$$
(with N-R³ in the ring)

In formula III, $R^3$ is selected from H, alkyl, aryl, alicyclic or heterocyclic;

$R^4$ is an aryl group; each $R^5$ and each $R^6$ is independently selected from alkyl, aryl, alicyclic and heterocyclic; and Z represents O or a covalent bond.

In this context, "alkyl" refers to alkyl groups of up to 20, preferably up to 10, and most preferably up to 5 carbon atoms. "Aryl" refers to aromatic rings or fused ring systems of up to 14, preferably up to 10, most preferably up to 6 carbon atoms. "Alicyclic" refers to non-aromatic rings or fused ring systems of up to 14, preferably up to 10, most preferably up to 6 carbon atoms. "Heterocyclic" refers to aromatic or non-aromatic rings or fused ring systems of up to 14, preferably up to 10, most preferably up to 6 atoms selected from C, N, O and S. All of the above groups may be substituted by one or more atoms or groups such as hydroxyl, alkoxy, halogen and nitrile.

As is well understood in this technical area, a large degree of substitution is not only tolerated, but is often advisable. As a means of simplifying the discussion, the terms "nucleus", "groups" and "moiety" are used to differentiate between chemical species that allow for substitution or which may be substituted and those which do not or may not be so substituted. For example, the phrase "alkyl group" is intended to include not only pure hydrocarbon alkyl chains, such as methyl, ethyl, octyl, cyclohexyl, iso-octyl, t-butyl and the like, but also alkyl chains bearing conventional substitutents known in the art, such as hydroxyl, alkoxy, phenyl, halogen (F, Cl, and I), cyano, nitro, amino etc. The term "nucleus" is likewise considered to allow for substitution. The phrase "alkyl moiety" on the other hand is limited to the inclusion of only pure hydrocarbon alkyl chains, such as methyl, ethyl, propyl, cyclohexyl, iso-octyl, t-butyl etc.

British Patent Application No. 9508027 discloses the bleaching of certain dyes by means of their photoirradiation in the presence of compounds of formula III in what is believed to be a photoredox process, but it is now apparent that an effect of this process is that the compounds of formula III are themselves bleached in the process, and this effect may be exploited for the imaging purposes described herein. Compounds of formula III absorb strongly in the UV/blue region, but when formulated with a suitable dye and irradiated at wavelengths absorbed by the dye, the UV/blue absorption shifts to shorter wavelengths. Although it is rather unusual for organic compounds to suffer bleaching as a result of their oxidation (the reverse is often the case - cf. the conversion of leuco dyes into dyes), it is surmised that the compounds of formula III are oxidised by photoexcited dye molecules, because formulations comprising a dye and a compound of formula III bleach readily under condition of photoirradiation, but not when heated in the dark. Also, there are reports in the academic literature of similar compounds acting as reducing agents towards photoexcited species (J.Amer.Chem.Soc. 1981 (103), 6495–7).

A metal salt stabiliser may be used in conjunction with compounds of formula III, e.g., a magnesium salt, as this has been found to improve the thermal stability of the system without affecting the photoactivity. Quantities of about 10 mole% based on the compound of formula III are effective.

In formula III, $R^3$ is preferably H or phenyl (optionally substituted), $R^4$ is preferably phenyl (optionally substituted), $R^5$ is preferably lower alkyl (of 1 to 4 carbon atoms, esp. methyl) and $R^6$ is preferably lower alkyl (e.g., ethyl). Compounds in which Z represents a covalent bond show enhanced absorption in the blue region, and hence are preferred for many applications. Compounds of formula III may be synthesised by co-condensation of an aldehyde, an amine and two equivalents of a beta-ketocarbonyl compound in an adaptation of the well known Hantsch pyridine synthesis:

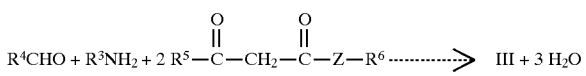

The other key ingredient of imaging elements of the invention is a dye (b) which absorbs at relatively long wavelengths. Since the elements are primarily intended for laser address, preferred dyes absorb in the red and/or near infrared region to be compatible with the commonly used diode lasers and YAG lasers etc. As indicated earlier, the mechanism by which the short wavelength absorption of the compound (a) is bleached may influence the choice of dye (b). If a purely thermal bleaching mechanism operates, then the only restriction on the dye (b) is that it should act as an efficient photothermal converter, i.e., it should absorb the laser output and generate heat as a result. A vast range of red and infrared dyes are known to be suitable for this purpose, including cyanines, phthalocyanines, polymethines, oxonols, squarylium dyes, croconium dyes and diamine dication dyes.

On the other hand, if the bleaching process requires the presence of acid, then the dye (b) preferably generates acid via laser photolysis. (Alternatively, a thermal source of acid may be used in combination with a photothermal converting dye as described above). Examples of IR-absorbing dyes having acid-generating properties include the tetraarylpolymethine (TAPM) dyes, which are described, for example, in U.S. Pat. No. 5135842. Preferred examples have a nucleus of general formula IV:

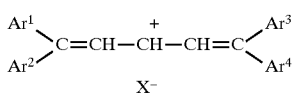

$$\begin{matrix} Ar^1 \\ Ar^2 \end{matrix} C=CH-CH-CH=C \begin{matrix} Ar^3 \\ Ar^4 \end{matrix} \quad \text{IV}$$

$$X^-$$

where $Ar^1$–$Ar^4$ are aryl groups which may be the same or different such that at least two of $Ar^1$–$Ar^4$ have a tertiary amino group in the 4-position, and X is an anion. Examples of tertiary amino groups include dialkylamino groups, diarylamino groups, and cyclic substitutents such as pyrrolidino, morpholino or piperidino. The tertiary amino group may form part of a fused ring system, e.g., one or more of $Ar^1$–$Ar^4$ may represent a julolidine group.

Preferably the anion X is derived from a strong acid (e.g. HX should have a pKa of less than 3, preferably less than 1). Suitable identities for X include $ClO_4$, $BF_4$, $CF_3SC_3$, $PF_6$, $AsF_6$ or $SbF_6$. Such dyes are believed to form the acid HX on irradiation, and the effect appears to be particularly strong when not all of $Ar^1$–$Ar^4$ are identical. Preferred dyes of formula IV include the following:

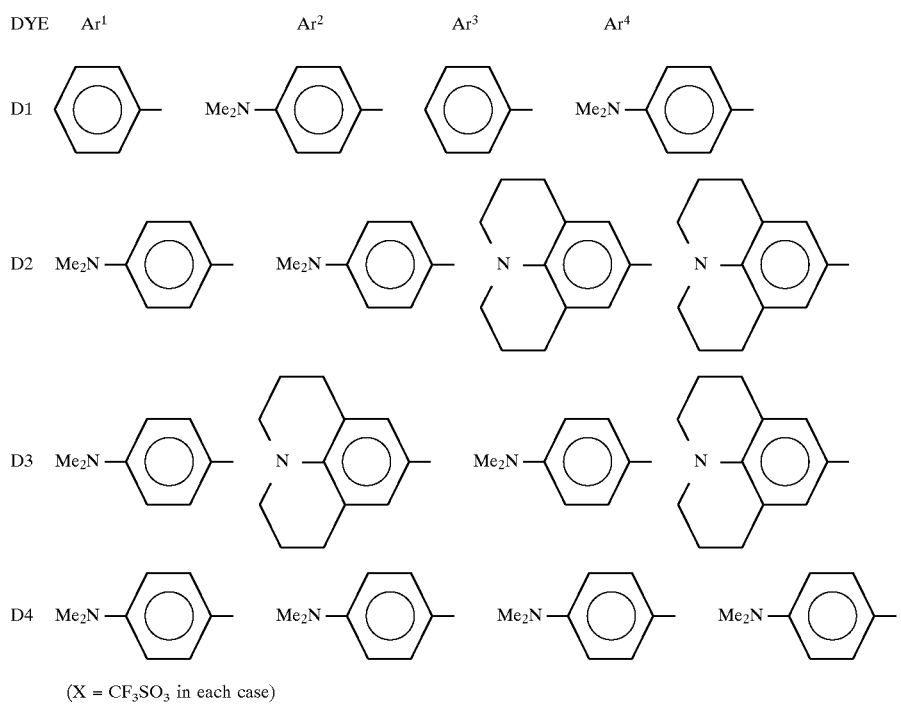

(X = $CF_3SO_3$ in each case)

Another preferred class of acid-generating dye is the amine cation radical dyes, also known as immonium dyes, having counterions derived from strong acids, described for example in W90/12342 and JP51-88016. These include diamine di-cation dyes (exemplified by the commercially available Cyasorb™ IR165 (Glendale Protective Technologies, Inc.)), which have a nucleus of general formula V and absorb in the YAG laser wavelength range:

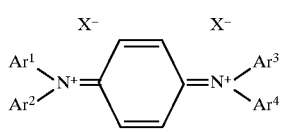

in which $Ar^1$–$Ar^4$ and X have the same meaning as before.

When bleaching is effected by a photoredox process, particularly when the dye acts as a photo-oxidant, the preferred dyes are cationic dyes (i.e., they have a positive charge associated with the chromophore). Examples include polymethine dyes, pyrylium dyes, cyanine dyes, diamine di-cation dyes, phenazinium dyes, phenoxazinium dyes, phenothiazinium dyes and acridinium dyes, but the most preferred dyes are the TAPM dyes of formula IV and the diamine di-cation dyes of formula V.

The imaging elements of the invention may be prepared by dissolving the dye and the bleachable compound in a suitable solvent and coating the mixture on a transparent substrate. The substrate must be transparent from the near UV to the near infrared, and should be flexible, dimensionally stable and heat resistant. Conventional polyester base (e.g., polyethyleneterephthalate and polyethylenenaphthalate of thickness 20–200 microns) is suitable, and may optionally be treated (e.g., by corona discharge, or application of subbing layers) to modify its wettability towards subsequent coatings. Any conventional coating method may be used, such as spin coating, bar coating, roller coating or knife coating.

The relative quantities of the ingredients may vary with the extinction coefficients of the materials themselves and the intended use. The dye should be present in sufficient quantity to provide an optical density of at least 0.75, preferably at least 1.0 at the output wavelength of the laser source. The bleachable compound should be present in sufficient quantity to provide an optical density of at least 1.0, preferably at least 1.5, at the shorter wavelength.

Higher imaging speeds are obtained when the dye and bleachable compound are coated on the substrate without the addition of a binder. The preferred materials described above form good quality coatings in the absence of binders, e.g., when vapor deposited or coated as solutions of about 2–15 wt % solids in typical organic solvents and solvent mixtures, such as alcohols, ketones, esters and ethers. However, binders may be used if necessary, including vinyl resins, acrylate resins, cellulose esters and polycarbonates. Surfactants and/ or other coating aids may be added if necessary.

Binderless coatings of the preferred materials are surprisingly durable, but greater durability can be obtained by the use of a transparent topcoat. In order that the application of the topcoat does not disrupt the imaging layer, it is preferable that the topcoat be coated from a solvent that is incompatible with the imaging layer, e.g., water. Hence hydrophilic materials such as gelatin or polyvinylalcohol are particularly suitable as topcoats.

The elements of the invention may be imaged by conventional techniques. The element may be mounted on a suitable stage, e.g., by vacuum hold down, and scanned by a suitable laser. The element may be imaged by any of the commonly-used lasers, depending on the dye used, but address by near infrared emitting lasers such as diode lasers and YAG lasers, is preferred.

Good results are obtained from a relatively high intensity laser exposure, e.g., of at least $10^{23}$ photons/cm$^2$/sec. For a laser diode emitting at 830 nm, this corresponds approximately to an output of 0.1 W focused to a 20 micron spot with a dwell time of about 1 microsecond. In the case of YAG laser exposure at 1064 nm, a flux of at least $3 \times 10^{24}$ photons/cm$^2$/sec is preferred, corresponding roughly to an output of 2W focused to a 20 micron spot with a dwell time of about 0.1 microsecond.

Any of the known scanning devices may be used, e.g. flat-bed scanners, external drum scanners or internal drum scanners. In these devices, the element to be imaged is secured to the drum or bed (e.g., by vacuum hold-down) and the laser beam is focused to a spot (e.g., of about 20 microns diameter) on the absorbing layer. This spot is scanned over the entire area to be imaged while the laser output is modulated in accordance with electronically stored image information. Two or more lasers may scan different areas of the element simultaneously, and if necessary, the output of two or more lasers may be combined optically into a single spot of higher intensity.

As a result of the above imaging process, the media in accordance with the invention become transparent to UV/blue light in exposed areas, but remain opaque to UV/blue light in non-exposed areas. In some embodiments, the laser absorbing dye will also bleach in exposed areas, as described in our copending application of even date, but this is of secondary importance to the present invention. No further processing is needed to develop or fix the image. The resulting imaged elements may be used as contact masks, in the same way as conventional graphic arts films, for the subsequent duplication of the image information (in positive or negative mode) in another medium. Thus, they may be used for the contact exposure (in a conventional printing frame, for example) of silver halide contact or duplicating films, lith films, colour proofing materials, printing plates, or indeed any material adapted for exposure to UV/blue radiation via a contact mask.

In an alternative embodiment, the imaging medium of the invention may be incorporated in an imaging element sensitive to UV/blue radiation in a manner that enables formation of an integral mask for the ultimate flood exposure of the element to UV/blue light. Elements in accordance with this aspect of the invention generally comprise a substrate, a second imaging medium sensitive to UV/blue light, and a first imaging medium which is of the type described above. The first imaging medium of the invention must be present as one or more layers that are separate from the second imaging medium, and positioned so that an image formed in the first imaging medium can act as a mask for exposure of the second imaging medium. The second imaging medium may take the form of any conventional photosensitive medium, such as a photoresist of the type used to form printing plates or proofing elements. Such resists may be positive-acting (photosolubilising) or negative-acting (photoinsolubilising), or may be susceptible to peel-apart development as described below. In use, the element is first exposed as described above to form an image in the first imaging medium. This is followed by flood exposure from a suitable source (e.g., a metal halide lamp or mercury lamp). The exposure may also be effected by laser scanning at the appropriate wavelength, with the entire mask surface scanned by the laser. Areas of the first imaging medium which did not receive exposure in the first step remain opaque and block the passage of light during the flood exposure. Conversely, areas that did receive exposure in the first step become transparent, and permit passage of light in the flood exposure. Thus the flood exposure results in the second imaging medium undergoing an imagewise irradiation that duplicates the pattern formed in the first imaging medium by the first exposure. The final step is processing by any method suitable for developing and fixing the image formed in the second imaging medium. For example, the exposed (or unexposed) areas may be washed off by a suitable developer, or a peel-apart process may reveal the final image.

This embodiment has the advantage of a single-sheet construction, with no need for a vacuum frame in the final exposure. Because the mask image may be generated in close proximity to the UV/blue sensitive medium, high resolution imaging of the latter is possible, without the optical artifacts that may arise from contacting two sheets.

The exact spatial relationship of the substrate, first imaging medium and second imaging medium may vary depending on whether the substrate is opaque or transparent. When the substrate is opaque, as is the case of a printing plate with an aluminium base, for example, the first (mask forming) imaging medium must be coated on top of the photosensitive layer of the plate, and exposure must take place from that side. To prevent intermixing of the two imaging chemistries, particularly at the coating stage, it may be necessary to coat a barrier layer on top of the conventional plate coating prior to coating the mask forming chemistry. Water-soluble polymers such as gelatin or polvinylalcohol are preferred barrier materials, e.g., at a dry thickness of 1–5 microns.

When the substrate is transparent, as is the case of a colour proofing element, the mask-forming chemistry may be positioned above the conventional photosensitive layer, or between the substrate and the conventional photosensitive layer, or on the back side of the substrate. Depending on the direction of flood exposure, any of these positions may be suitable.

In the case of proofing elements intended for the assembly of an integral colour proof, the mask-forming chemistry must be either on the back side of the substrate, or between the substrate and the photosensitive layer. Conventional proofing elements of this type may comprise (in sequence) a transparent substrate, a photosensitive layer, a coloured layer and an adhesive layer. The photosensitive and coloured layers may be combined in a single layer, and other layers, such as barrier layers or release layers may also be present, depending on the particular construction. In use, conventional materials of this type may be first laminated to a reflective base, such as white paper or card, then flood exposed through a contact mask before or after removing the transparent substrate. Strippable or non-strippable antihalation layers may also be associated with the photosensitive medium.

Development of the image either involves selective wash off of exposed or unexposed areas, or alternatively the action of peeling the transparent substrate subsequent to exposure may selectively remove exposed or unexposed areas of the coloured layer. The latter process is known as peel-apart development, and is described in European Application. No. 93309507.7 and WO92/15920. The entire process is repeated using different coloured elements until a full colour image is assembled on the base.

Proofing elements in accordance with this aspect of the invention differ from their conventional counterparts only in that the mask-forming chemistry is coated either on the back side of the transparent substrate or between the transparent substrate and the photosensitive layer. After lamination to a reflective base, the transparent substrate is left in place and the mask is generated by long wavelength exposure as described previously. After flood exposure through the mask, the transparent substrate is peeled away. In a peel-apart element, this develops the image, otherwise conventional wet development is carried out.

From a manufacturing stand point, it is more convenient to coat the mask-forming chemistry on the back of the transparent substrate, as existing products may be modified with the minimum of disruption to the manufacturing process. On the other hand, various advantages may stem from coating the mask-forming chemistry between the substrate and photosensitive layer. Firstly, the mask is generated immediately adjacent the photosensitive layer, which makes for high resolution and eliminates optical distortions caused by the thickness of the substrate. Secondly, the Dmin areas of the mask seldom bleach to zero optical density, and the residual absorption can provide an antihalation effect, leading to improved resolution, dot gain control and exposure latitude, as described in EP-A-165030.

The images produced by laser exposure of the media of the invention, in their simplest embodiments, appear rather faint to the naked eye because the image density is largely in the UV. This does not affect their utility as contact masks as described above, although a higher visual contrast is desirable for the user's convenience. If other applications, such as medical imaging, are contemplated, then a more visible image, preferably a neutral black, is essential. In the preferred embodiments of the invention, which comprise a compound of formula III and a dye of formula IV, this may be achieved by incorporating one or more visible-absorbing oxonol dyes in addition to the aforementioned ingredients. The oxonol dyes provide optical density in the visible region (400–700 nm), and by combining oxonols with appropriate absorption characteristics, a neutral black can be obtained. The oxonols bleach cleanly during laser exposure along with the compound of formula III. Surprisingly, there is no significant speed loss due to the additional presence of the oxonols. The extent of bleaching varies with the intensity and/or duration of laser exposure, and so continuous tone imaging is possible.

The mechanism of the oxonol bleaching is not well understood. Coatings comprising a dye of formula IV or V and one or more oxonols undergo partial bleaching on laser exposure, but the additional presence of a compound of formula III provides much more rapid and complete bleaching. Suitable oxonol dyes are of the type disclosed in U.S. Pat. No. 4,701,402, and specific examples include:

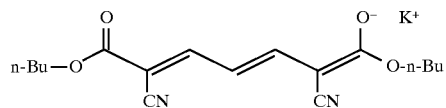

3

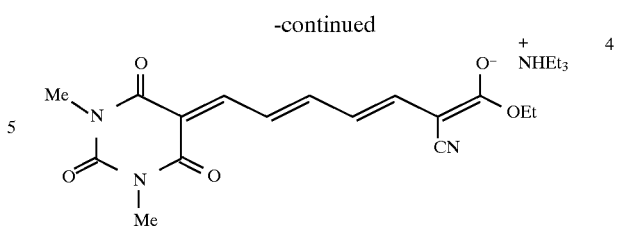

4

A second manner in which the basic construction may be elaborated to provide broader utility involves the inclusion of a thermally transferable colourant layer, and use of the resulting material as a laser addressable thermal transfer donor. The generation of colour images by transfer of a colourant from a donor to a receptor in response to laser irradiation is well known. By successive transfer of yellow, magenta, cyan and black images from the appropriate donors to a common receptor, full colour images of high quality, suitable for proofing, may be obtained (as described in WO90/12342, U.S. Pat. No. 5,171,650, and EP-A-0602893. In systems involving mass transfer of colourant (i.e., where there is either 0% or 100% transfer of image density depending on whether the input energy exceeds a given threshold), it has been recognised that the imaged donor sheet represents a negative of the image formed on the receptor, and could potentially be used as a mask for the contact exposure of other media. However, various problems limit the usefulness of this approach. Firstly, the dyes and pigments commonly used as colourants in the proofing industry do not absorb strongly in the UV/blue region, and hence the mask formed by the donor has insufficient image density. Use of an inert UV absorber in addition to the colourant may solve this problem, but unless the added UV absorber is completely colourless, the transferred image will be degraded. Secondly, mass transfer media do not necessarily transfer all of the colourant from exposed areas of the donor. In particular, when transfer occurs by the "melt-stick" mechanism, there is a tendency for a significant residue to remain on the exposed parts of the donor. This does not affect the quality of the image on the receptor, but if the colourant is UV-absorbing, or an inert absorber has been added, then use of the imaged donor as a mask will be hampered by a high Dmin.

These problems do not arise when the materials of the present invention are used in conjunction with a thermally transferable colourant. The presence of a compound such as those of formulae I–III ensures an adequate optical density in the UV/blue region regardless of the properties of the colourant itself, and because the compound bleaches during laser exposure, the Dmin in exposed areas is low even when a residue of colourant remains on the donor. Likewise, the bleaching process avoids the problem of contamination of the transferred image by cotransfer of the UV-absorbing compound. It is therefore possible to form high quality colour proofs made up of individual colour separation images (yellow, magenta, cyan etc) at the same time (and as a direct result of the same series of laser scans) as producing matching film masks corresponding to the colour separation information, thereby maximising the productivity of the expensive scanning equipment.

Therefore, according to a further aspect of the invention there is provided an imaging element comprising a substrate and an imaging medium comprising (a) a compound absorbing at a first wavelength in the UV/blue region and (b) a dye absorbing at a second wavelength which is longer than said first wavelength, irradiation of the medium at said second wavelength bleaching absorption of the compound (a) at the first wavelength, said imaging medium additionally comprising a thermally transferable colourant.

There is further provided an imaging method comprising the steps of:

(i) assembling in contact with a receptor a first imaging element of the type described in the previous paragraph;

(ii) exposing the assembly to a pattern of radiation of the said second wavelength so as to cause thermal transfer of colourant to the receptor in irradiated areas and to bleach absorption of the compound (a) at the said first wavelength;

(iii) separating said first imaging element from the receptor and assembling said first imaging element in contact with a second imaging element which is sensitive to radiation of the first wavelength; and (iv) exposing the assembly to a source of radiation of the first wavelength.

Essentially any of the known mass-transfer colourant systems may be used in this embodiment of the invention, including waxy pigmented layers (JP63-319192), ablative materials (WO90/12342, U.S. Pat. No. 5,171,650) and binderless layers of vapour deposited dyes or pigments (International Patent Application PCT/GB92/01489). The preferred transferable colourant, however, comprises a dispersion of pigment particles in a binder together with a fluorochemical additive, as described in EP-A-0602893. Materials in accordance with the present invention may be prepared simply by adding a bleachable UV/blue absorber to the laser transfer imaging media described therein. The UV/blue absorber may be present in the colourant layer or in a separate layer, but for optimum bleaching it should be in the same layer as the laser-absorbing dye.

A further embodiment of the present invention, providing enhanced productivity, combines the functions of a film and a printing plate. EP-A-0652483 describes laser addressable printing plates requiring no dissolution processing which comprise a substrate bearing an infrared-sensitive coating, which coating becomes relatively more hydrophillic on exposure to infrared radiation. In preferred embodiments, the coating comprises an infrared absorber and a polymer having pendant hydrophobic groups which react under the action of heat and/or acid to form hydrophillic groups. Most preferably, the infrared absorber generates an acid by absorption of radiation and/or an additional source of acid is present in the coating. The preferred reactive polymer is a copolymer of tetrahydropyranyl methacrylate and a vinyl-functional alkoxysilane. Suitable substrates include transparent polyester film. The coating is initially hydrophobic and hence readily accepts inks commonly used in lithographic printing. On exposure to infrared radiation, the coating becomes relatively more hydrophillic, so that in the presence of aqueous press fountain solutions the exposed areas are ink-repellent, i.e., the plate is positive-acting. The preferred source of IR radiation is a laser diode, and so the plates have the unique combination of digital addressability and no requirement for wet processing.

The acid-generating dyes preferred for use in the printing plate described above are identical to the dyes of formulae IV and V preferred for use in the present invention. Hence, by adding a bleachable UV/blue absorber (such as a compound of one of formulae I–III) to the plate formulation, there is obtained a laser-addressable imaging element that combines the functions of a film and a printing plate (provided the formulation is coated on transparent base). The bleach chemistry does not interfere with the plate-forming chemistry, and vice-versa.

Thus, a film/plate of the invention may be imaged in the normal way by a laser scanner, and the resulting imaged element used as a mask for the contact exposure of a colour proof, for example. Thereafter, the imaged element may be mounted on press without further processing and used to print multiple copies in the normal way. Once again, the productivity of the expensive scanning equipment is maximised.

The invention is hereinafter described in more detail by way of example only with reference to the accompanying figure which shows the absorption spectra of a film following exposure at different scan rates.

In the examples, the following materials are used;

Dyes D1 and D4 —polymethine dyes absorbing at ca. 830 nm, structures as follows:

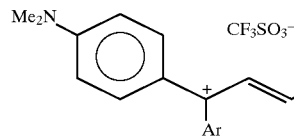
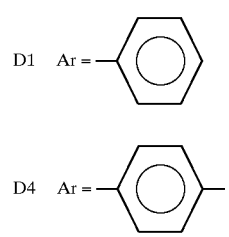

IR165 —"Cyasorb IR165", an IR absorbing (ca. 1060 nm) diamine di-cation dye supplied by Glendale Protective Technologies.

Compounds (1) and (2)—heat and/or acid bleachable UV absorbers of formulae:

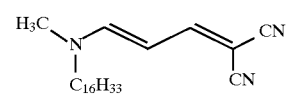

Compounds (3) and (4)—visible absorbing oxonol dyes of formulae:

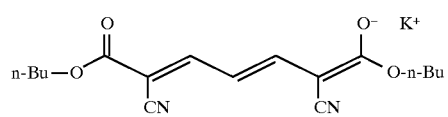

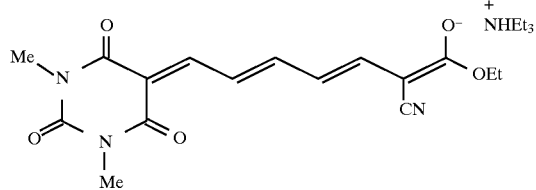

Compounds (5) and (6)—UV absorbing dihydropyridines of formulae:

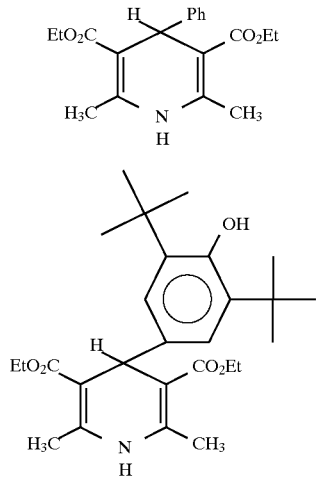

MEK—methyl ethyl ketone (2-butanone).

VAGH and VYNS—vinyl resins supplied by Union Carbide.

FC—N-methylperfluorooctanesulphonamide.

THP homopolymer—poly(tetrahydropyran-2-yl methacrylate), prepared as described in WO92/09934.

Butvar™ B76—polyvinylbutyral, supplied by Monsanto.

DRC(TM) Film—a negative-acting, high contrast graphic arts contact film supplied by 3M.

EXAMPLE 1

This example demonstrates direct formation of UV masks by media in accordance with the invention.

The following formulation was coated on 102 micron unsubbed polyester at 12 micron wet thickness and air dried to produce Element 1 :

| | |
|---|---|
| Butvar ™ B76 (10 wt % in MEK) | 5.5 g |
| Dye D1 | 0.125 g |
| Compound (1) | 0.20 g |

The resulting coating had an Optical Density (OD) of 2.8 at 380 nm and 1.2 at 830 nm. It was mounted on an external drum scanner and imaged by means of a laser diode (830 nm, 100 mW, 20 micron spot) scanned at 200 cm/sec. In the exposed areas, the UV absorption was bleached to OD 0.6. The imaged element was placed in contact with a piece of DRC film and exposed to a 5 kW UV source in the conventional manner. After conventional processing, the DRC film bore a negative replica of the original image.

Elements 2 and 3 were prepared by the same method using the following formulation:

| | |
|---|---|
| Butvar ™ B76 (10 wt % in MEK) | 5.5 g |
| Dye D1 | 0.1 g |
| Bleachable Compound | 0.6 g |

Compound (5) was used in Element 2, giving OD 1.8 at 350 nm, and Compound (6) in Element 3, giving OD 1.5 at 350 nm. When subjected to the above imaging process, the OD in both cases fell to 0.6, and the resulting masks were used successfully for the exposure of DRC film as before.

EXAMPLE 2

This example demonstrates direct formation of UV masks by binderless media in accordance with the invention.

The following formulations were coated on unsubbed polyester base (102 micron) at 12 micron wet thickness and allowed to dry, to produce Elements 3–8:

| Element | 4 | 5 | 6 | 7 | 8 |
|---|---|---|---|---|---|
| MEK | 5 | 5 | 5 | 5 | 5 |
| EtOH | 0.2 | 0.2 | 0.2 | 0.2 | 0.2 |
| Dye D1 | 0.1 | — | 0.1 | — | — |
| Dye D4 | — | 0.1 | — | — | — |
| IR165 | — | — | — | 0.1 | 0.1 |
| Compound (1) | 0.1 | — | — | 0.1 | — |
| Compound (2) | — | 0.1 | — | — | — |
| Compound (5) | — | — | 0.6 | — | 0.6 |

(all quantities are parts by weight)

Elements 4–7 were mounted on an external drum scanner and imaged by a laser diode (830 nm, 110 mW, focused to 20 micron spot), scanned at 200 cm/sec to write tracks on the media. Element 8 was mounted on an internal drum scanner and imaged by a YAG laser (1060 nm, 2 W, focused to 26 micron spot), scanned at 6400 cm/sec, to write tracks on the media. The optical densities at 360 nm before and after exposure are recorded in the following table:

| | OD(initial) | OD(final) |
|---|---|---|
| Element 4 | 1.8 | 0.6 |
| Element 5 | 1.8 | 0.6 |
| Element 6 | 2.0 | 0.3 |
| Element 7 | 1.8 | 0.6 |
| Element 8 | 1.8 | 0.3 |

The results demonstrate efficient bleaching of the UV absorption in all cases.

EXAMPLE 3

This example demonstrates the use of oxonol dyes to provide a neutral black coating which is bleachable by laser exposure. Element 9 was prepared as before, using the following formulation:

| | |
|---|---|
| MEK | 3.5 g |
| Ethanol | 0.5 g |
| Dye D4 | 0.05 |
| Compound (3) | 0.025 g |
| Compound (4) | 0.05 g |
| Compound (5) | 0.3 g |

The mixture was roll-milled in a brown bottle under dim light for 30 minutes prior to coating.

The resulting film was neutral black in appearance, and had the absorption spectrum denoted by curve A in FIG. 1 which represent a plot of optical density against wavelength. Curves B and C of FIG. 1 denote the spectrum after laser exposure at scan speeds of 400 and 200 cm/sec respectively (830 nm laser diode, 116 mW, 20 micron spot). Clearly, bleaching occurs across the spectrum in proportion to the degree of exposure, indicating that the film is suitable for continuous tone imaging.

Another sample of the same film was imaged with a half tone dot pattern via laser scanning at 200 cm/sec, and the resulting mask was used successfully to image DRC film as before.

EXAMPLE 4

This example demonstrates the simultaneous generation of matched film and proof images in accordance with the invention.

Magenta and black millbases were prepared by dispersing 4g of the appropriate pigment chips in 32g MEK using a McCrone Micronising Mill. The pigment chips were prepared by standard procedures and comprised VAGH binder and either blue shade magenta pigment or black pigment in a weight ratio of 2:3.

Element 10 was prepared by coating the following formulation as in previous examples:

| | |
|---|---|
| Magenta millbase | 5.5 g |
| MEK | 5.5 g |
| Ethanol | 0.5 g |
| Dye D1 | 0.165 g |
| Compound 5 | 0.85 g |
| Magnesium nitrate | 0.05 g |
| FC | 0.025 g |

A sample of the resulting donor sheet was assembled in face to face contact with a receptor sheet (VYNS coated paper) and mounted on an external drum scanner. Line scans were made at 200, 400, 600, 800 and 1000 cm/sec using an 830 nm laser diode (100 mW, 20 micron spot diameter), and transfer of magenta pigment was observed for scans at 600 cm/sec or less, although a residue of pigment remained in the exposed areas. The imaged donor was then used as a mask for the exposure of DRC film as before, and an accurate replica of the image formed on the receptor was obtained.

Elements 11 and 12 were prepared in identical fashion from the following formulations:

| | Element 11 | Element 12 |
|---|---|---|
| Magenta millbase | — | 5.5 g |
| Black millbase | 2.75 g | — |
| MEK | 2.5 g | 2.0 g |
| Ethanol | 0.5 g | 1.0 g |
| IR165 | 0.06 g | 0.2 g |
| Compound (5) | 0.35 g | 0.6 g |
| FC | 0.125 g | 0.025 g |

Element 11 was imaged in the same way as Element 10, with pigment transfer observed at scan speeds of 400 cm/sec or less. The imaged donor was again used successfully as a mask for the exposure of DRC film.

Element 12 was contacted face to face with "Rainbow" (TM) thermal transfer imaging receptor (supplied by 3M) and imaged via a YAG laser as described for Element 8 in Example 2. A magenta image was formed on the receptor in response to the laser exposure (line width 17 microns). The imaged donor was again used to image DRC film, and the line width of the resulting DRC film image matched that of the receptor image.

EXAMPLE 5

This example demonstrates simultaneous generation of film and plate images by media in accordance with the invention.

Element 13 was prepared as for previous examples from the following formulation:

| | |
|---|---|
| THP homopolymer (10 wt % in MEK) | 5.5 g |
| Dye D1 | 0.15 g |
| Compound (1) | 0.20 g |

The resulting coating was pale pink in colour and showed an intense UV absorption band (OD>3.0). Laser imaging was carried out as before at scan rates in the range 200–800 cm/sec. Bleaching of both the IR and UV absorptions was seen in exposed areas. The imaged element was then used as a mask for the UV exposure of a positive acting peel-apart colour proofing element of the type described in EP-A-0601760. The result was a positive reproduction of the image present on Element 13.

The imaged Element 13 was then mounted on an Apollo web-fed printing press, wiped with fountain solution (Mander Kidd), and inked with Van Son Black 40904 (rubber based) ink. The laser-exposed areas repelled the ink, whereas the non-exposed areas inked up cleanly within a few revolutions of the plate cylinder. 100 impressions on newsprint were taken without signs of wear or background toning. The printed images were an exact replica of the colour proof image.

We claim:

1. An image-forming element comprising a substrate, and an image-forming medium comprising
   (a) a compound absorbing at a first wavelength in the UV/blue region which has the general formula III

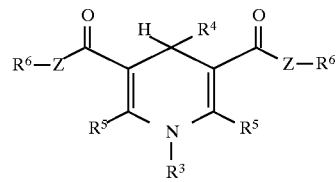

wherein $R^3$ and $R^4$ are independently members selected from the group consisting of H, alkyl, aryl, alicyclic, and heterocyclic groups:
   each $R^5$ and each $R^6$ are independently members selected from the group consisting of alkyl, aryl, alicyclic and heterocyclic groups; and
   Z is a member selected from the group consisting of O and a covalent bond; and
   (b) a dye absorbing at a second wavelength which is longer than the first wavelength, wherein irradiation of said dye absorbing at said second wavelength causes bleaching of the absorption of said compound of formula III.

2. Image-forming element according to claim 1, wherein the second wavelength is in the red or near infrared region and said element is laser addressable.

3. Image-forming element according to claim 1 further comprising a metal salt stabiliser.

4. Image-forming element according to claim 3 wherein said metal salt stabiliser is a magnesium salt, present in an amount of about 10 mole% based on the compound of the formula III.

5. Image-forming element according to claim 1 wherein $R^3$ is a member selected from the group consisting of H and phenyl (substituted or unsubstituted), $R^4$ is phenyl (substituted or unsubstituted), and $R^5$ and $R^6$ are lower alkyl.

6. Image-forming element according to claim 1 wherein said dye (b) is selected from the group consisting of cyanines, phthalocyanines, polymethines, oxonols, squarylium dyes, croconium dyes and diamine di-cation dyes.

7. Image-forming element according to claim 1 wherein said dye (b) is a tetra-aryl polymethine (TAPM) dye.

8. Image-forming element according to claim 7 wherein said TAPM dye has the general formula IV

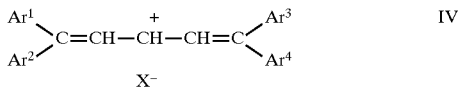

where $Ar^1$ to $Ar^4$ are aryl groups which may be the same or different such that at least of two of $Ar^1$ to $Ar^4$ have a tertiary amino group in the four position, and X is an anion.

9. Image-forming element according to claim 8 wherein said tertiary amino group is a member selected from the group consisting of dialkylamino groups, diarylamino groups and cyclic substitutents, or forms part of a fused ring system.

10. Image-forming element according to claim 8 wherein X is derived from a strong acid, HX having pKa of less than 3.

11. Image-forming element according to claim 10 wherein X is a member selected from the group consisting of $ClO_4$, $BF_4 CF_3SO_3$, $PF_6$, $AsF_6$ and $SbF_6$.

12. Image-forming element according to claim 8 wherein $Ar^1$ to $Ar^4$ are members selected from the group consisting of phenyl, and dimethylaminophenyl, and X is $CF_3SO_3$.

13. Image-forming element according to claim 1 wherein said dye (b) is an immonium dye.

14. Image-forming element according to claim 13 wherein said dye is a diamine dication dye, having a nucleus of general formula V

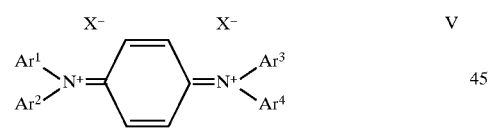

in which $Ar^1$ to $Ar^4$ are aryl groups which may be the same or different such that at least two of $Ar^1$ to $Ar^4$ have a tertiary amino group in the four position and X is an anion.

15. An imaging element as claimed in claim 1 further comprising a second image-forming medium which is UV sensitive, wherein the first image-forming medium comprising components (a) and (b) is located such that an image formed therein may act as an exposure mask for said second image-forming medium.

16. An imaging element according to claim 1 additionally comprising one or more visible-absorbing oxonol dyes.

17. An imaging element according to claim 1 additionally comprising a thermally-transferable colourant.

18. An imaging element according to claim 1 additionally comprising a polymer having pendant hydrophobic groups which react under the action of heat and/or acid to form hydrophilic groups.

19. Image-forming element according to claim 1 wherein the compound of formula III absorbs at a wavelength in the range of about 340–410 nm.

20. A method of imaging which comprises:
(i) providing an image-forming element comprising a substrate, and an image-forming medium comprising:
   (a) a compound absorbing at a first wavelength in the UV/blue region which has the general formula III

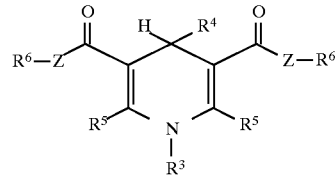

wherein $R^3$ and $R^4$ are independently members selected from the group consisting of H, alkyl, aryl, alicyclic, and heterocyclic groups;
   each $R^5$ and each $R^6$ are independently members selected from the group consisting of alkyl, aryl, alicyclic and heterocyclic groups; and
   Z is a member selected from the group consisting of O and a covalent bond; and
   (b) a dye absorbing at a second-wavelength which is longer than the first wavelength, wherein irradiation of said dye absorbing at said second wavelength causes bleaching of tee absorption of said compound of formula III; and
(ii) image-wise exposing said image-forming element to radiation at said second wavelength.

21. An imaging method which comprises the steps of:
(i) providing a first imaging element comprising an image-forming element comprising a substrate, and an image-forming medium comprising;
   (a) a compound absorbing at a first wavelength in the UV/blue region which has the general formula III

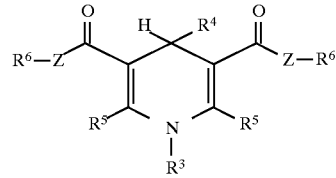

wherein $R^3$ and $R^4$ are independently members selected from the group consisting of H, alkyl, aryl, alicyclic, and heterocyclic groups;
   each $R^5$ and each $R^6$ are independently members selected from the group consisting of alkyl, aryl, alicyclic and heterocyclic groups; and
   Z is a member selected from the group consisting of O and a covalent bond; and
   (b) a dye absorbing at a second wavelength which is longer than the first wavelength, wherein irradiation of said dye absorbing at said second wavelength causes bleaching of the absorption of said compound of formula III;
(ii) exposing said first element to a pattern of radiation at said second wavelength;
(iii) assembling said exposed first element in contact with a second imaging element which is sensitive to light of the first wavelength; and
(iv) exposing the assembly to a source of light of the first wavelength with the first imaging element closest to the source.

22. A method of forming an image comprising the steps of:

(i) providing an imaging element comprising an image-forming element comprising;
a substrate;
an image-forming medium comprising;
(a) a compound absorbing at a first wavelength in the UV/blue region which has the general formula III

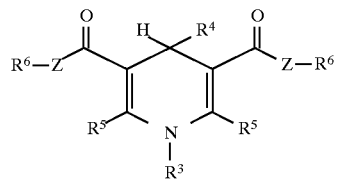

wherein $R^3$ and $R^4$ are independently members selected from the group consisting of H, alkyl, aryl, alicyclic, and heterocyclic groups;
each $R^5$ and each $R^6$ are independently members selected from the group consisting of alkyl, aryl, alicyclic and heterocyclic groups; and
Z is a member selected from the group consisting of O and a covalent bond; and
(b) a dye absorbing at a second wavelength which is longer than the first wavelength, wherein irradiation of said dye absorbing at said second wavelength causes bleaching of he absorption of said compound of formula III; and
a second image-forming medium which is UV sensitive wherein the first image-forming medium comprising components (a) and (b) is located such that an image formed therein may act as an exposure mask for said second image-forming medium;
(ii) exposing the element to a pattern of radiation at said second wavelength;
(iii) exposing the element to a source of radiation of the first wavelength; and
(iv) processing the element to develop an image in said second image forming medium.

23. An imaging method comprising the steps of:
(i) providing a first imaging element comprising a substrate and an imaging medium comprising;
(a) a compound absorbing at a first wavelength in the UV/blue region which has the general formula III

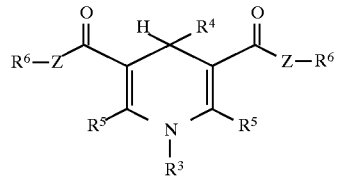

wherein $R^3$ and $R^4$ are independently members selected from the group consisting of H, alkyl, aryl, alicyclic, and heterocyclic groups;
each $R^5$ and each $R^6$ are independently members selected from the group consisting of alkyl, aryl, alicyclic and heterocyclic groups; and
Z is a member selected from the group consisting of O and a covalent bond; and
(b) a dye absorbing at a second wavelength which is longer than the first wavelength, wherein irradiation of the medium at said second wavelength causes bleaching o absorption of the compound (a) at the first wavelength, said imaging medium additionally comprising a thermally transferable colourant;

(ii) assembling in contact with a receptor said first imaging element;
(iii) exposing the assembly to a pattern of radiation at said second wavelength so as to cause thermal transfer of colourant to the receptor in irradiated areas and to bleach absorption of the compound (a) at said first wavelength;
(iv) separating said first imaging element from the receptor and assembling said first imaging element in contact with a second imaging element which is sensitive to radiation of the first wavelength; and
(v) exposing the assembly to a source of radiation at said first wavelength.

24. An image-forming element comprising a substrate, and an image-forming medium comprising:
(a) a compound absorbing at a first wavelength in the UV/blue region which has the general formula II

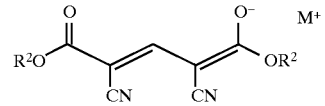

wherein each $R^2$ is independently a member selected from the group consisting of an alkyl group and an aryl group of up to 10 ring carbon atoms; and
$M^+$ represents a cation; and
(b) a dye absorbing at a second wavelength which is longer than the first wavelength, wherein irradiation at said second wavelength causes bleaching of the absorption of said compound of formula II.

25. Image-forming element according to claim 24 wherein the second wavelength is in the red or near infrared region and said element is laser addressable.

26. Image-forming element according to claim 24 wherein each $R^2$ is independently a member selected from the group consisting of an alkyl group of up to 20 carbon atoms and an aryl group of up to 6 ring carbon atoms.

27. Image-forming element according to claim 26 wherein the compound of formula II is

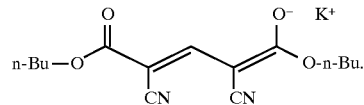

28. Image-forming element according to claim 24 wherein said dye (b) is selected from the group consisting of cyanines, phthalocyanines, polymethines, oxonols, squarylium dyes, croconium dyes and diamine di-cation dyes.

29. Image-forming element according to claim 24 wherein said dye (b) is a tetra-aryl polymethine (TAPM) dye.

30. Image-forming element according to claim 24 wherein said dye (b) is an immonium dye.

31. An imaging element as claimed in claim 24 further comprising a second image-forming medium which is UV sensitive, wherein the first image-forming medium comprising components (a) and (b) is located such that an image formed therein may act as an exposure mask for said second image-forming medium.

32. A method of imaging which comprises:
(i) providing an image-forming element comprising a substrate, and an image-forming medium comprising:
(a) a compound absorbing at a first wavelength in the UV/blue region which has the general formula II

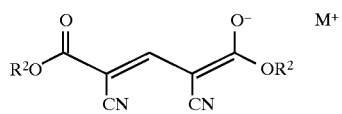

wherein each $R^2$ is independently a member selected from the group consisting of an alkyl group and an aryl group of up to 10 ring carbon atoms; and
$M^+$ represents a cation; and (b) a dye absorbing at a second wavelength which is longer than the first wavelength wherein irradiation of said dye absorbing at said second wavelength causes bleaching of the absorption of said compound of formula II; and (iii) image-wise exposing said image-forming element to radiation at said second wavelength.

33. An imaging method which comprises the steps of:
(i) providing a first imaging element comprising an image-forming element comprising a substrate, and an image-forming medium comprising:
  (a) a compound absorbing at a first wavelength in the UV/blue region which has the general formula II

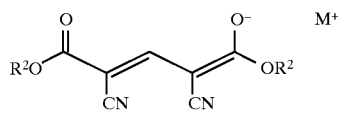

wherein each $R^2$ is independently a member selected from the group consisting of an alkyl group and an aryl group of up to 10 ring carbon atoms; and
$M^+$ represents a cation; and (b) a dye absorbing at a second wavelength which is longer than the first wavelength, wherein irradiation of said dye absorbing at said second wavelength causes bleaching of the absorption of said compound of formula II;

(ii) exposing said first element to a pattern of radiation at said second wavelength;

(iii) assembling said exposed first element in contact with a second imaging element which is sensitive to light of the first wavelength; and (iv) exposing the assembly to a source of light of the first wavelength with the first imaging element closest to the source.

34. A method of forming an image comprising the steps of:
(i) providing an imaging element comprising an image-forming element comprising:
a substrate;
an image-forming medium comprising:
  (a) a compound absorbing at a first wavelength in the UV/blue region which has the general formula II

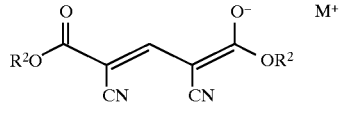

wherein each $R^2$ is independently a member selected from the group consisting of an alkyl group and an aryl group of up to 10 ring carbon atoms; and $M^+$ represents a cation; and (b) a dye absorbing at a second wavelength which is longer than the first wavelength, wherein irradiation of said dye absorbing at said second wavelength causes bleaching of the absorption of said compound of formula II; and
  a second image-forming medium which is UV sensitive wherein the first image-forming medium comprising components (a) and (b) is located such that an image formed therein may act as an exposure mask for said second image-forming medium;

(ii) exposing the element to a pattern of radiation at said second wavelength;

(iii) exposing the element to a source of radiation of the first wavelength; and (iv) processing the element to develop an image in said second image-forming medium.

35. An imaging method comprising the steps of:
(i) providing a first imaging element comprising a substrate and an imaging medium comprising:
  (a) a compound absorbing at a first wavelength in the UV/blue region which has the general formula II

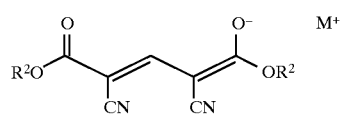

wherein each $R^2$ is independently a member selected from the group consisting of an alkyl group and an aryl group of up to 10 ring carbon atoms; and
$M^+$ represents a cation; and (b) a dye absorbing at a second wavelength which is longer than said first wavelength, where irradiation of the medium at said second wavelength causes bleaching of the absorption of the compound (a) at the first wavelength, said imaging medium additionally comprising a thermally transferable colourant;

(ii) assembling in contact with a receptor said first imaging element;

(iii) exposing the assembly to a pattern of radiation at said second wavelength so as to cause thermal transfer of colourant to the receptor in irradiated areas and to bleach absorption of the compound (a) at said first wavelength;

(iv) separating said first imaging element from the receptor and assembling said first imaging element in contact with a second imaging element which is sensitive to radiation of the first wavelength; and (v) exposing the assembly to a source of radiation of said first wavelength.

* * * * *